(12) United States Patent
Schnizler

(10) Patent No.: US 10,495,683 B2
(45) Date of Patent: Dec. 3, 2019

(54) POWER SUPPLY STRESS TESTING

(71) Applicant: VIAVI SOLUTIONS DEUTSCHLAND GMBH, Eningen Unter Achalm (DE)

(72) Inventor: Reiner Schnizler, Beuren (DE)

(73) Assignee: VIAVI SOLUTIONS DEUTSCHLAND GMBH, Eningen Unter Achalm (DE)

( * ) Notice: Subject to any disclaimer, the term of this patent is extended or adjusted under 35 U.S.C. 154(b) by 135 days.

(21) Appl. No.: 15/874,767

(22) Filed: Jan. 18, 2018

(65) Prior Publication Data

US 2019/0219629 A1    Jul. 18, 2019

(51) Int. Cl.
*G01R 31/28* (2006.01)
*G01R 31/319* (2006.01)
*G01R 31/40* (2014.01)

(52) U.S. Cl.
CPC ..... *G01R 31/2813* (2013.01); *G01R 31/2817* (2013.01); *G01R 31/31905* (2013.01); *G01R 31/31912* (2013.01); *G01R 31/40* (2013.01)

(58) Field of Classification Search
CPC .......... G01R 33/20; G01V 3/32; A61B 5/055; G01N 24/00

USPC .......... 324/764.01, 200, 300, 301, 307, 309
See application file for complete search history.

(56) References Cited

U.S. PATENT DOCUMENTS

| | | | | |
|---|---|---|---|---|
| 6,873,173 B2* | 3/2005 | Kollmer | ............... | G01R 31/275 324/750.16 |
| 6,937,047 B2* | 8/2005 | Tran | .................... | G01R 31/2884 324/750.3 |
| 7,492,180 B2* | 2/2009 | Forstner | .................. | G01S 7/032 324/750.3 |
| 2009/0179652 A1 | 7/2009 | Abara | | |
| 2015/0364927 A1 | 12/2015 | Yu et al. | | |

FOREIGN PATENT DOCUMENTS

| | | |
|---|---|---|
| CN | 101738567 A | 6/2010 |
| CN | 206442315 U | 8/2017 |
| EP | 1843161 | 10/2007 |
| WO | 2016/074429 | 5/2016 |

* cited by examiner

*Primary Examiner* — Giovanni Astacio-Oquendo
(74) *Attorney, Agent, or Firm* — Mannava & Kang, P.C.

(57) ABSTRACT

A test instrument performs a power supply stress test by invoking current surges in a device under test. The current surges are invoked by stimulating functional blocks in the device under test with test signals received via a network interface of the device under test.

20 Claims, 4 Drawing Sheets

POWER SUPPLY STRESS TESTING

BACKGROUND

There has been tremendous growth in packet-based services, such as Voice over Internet Protocol (VoIP) and Internet Protocol television (IPTV). The growth in packet-based services and an increase in end-user demand for direct Ethernet access are driving development and implementation of cost-effective high-speed Ethernet transmission systems. For example, 10 Gigabit Ethernet (10 GE) is a key enabling technology for high-speed Ethernet transmission, and network service providers are implementing it into their networks, including their local area networks (LANs), wide area networks (WANs), and optical transport networks (OTNs). Also, technology is moving towards 40 GE and 100 GE. Manufacturers of high-speed network transmission systems are faced with major challenges to provide networking components that can support multiple technologies and multiple standards, such as IEEE and ITU-T, to guarantee that all network layers interface properly. As a result, these manufacturers often rely on testing equipment to ensure their systems comply with multiple technologies and multiple standards.

In addition to testing the functionality of high-speed network transmission systems, the power distribution subsystems should be tested. For example, the power distribution subsystems implemented in the high-speed network transmission systems should be able to maintain the supply voltage with a high precision under all conditions, or components of the systems may fail. There should be no significant voltage over or undershoot regardless of supply current surge amplitude and frequency. This requires a power supply network with a low impedance over a wide frequency band.

Current surges caused by various standard operations performed by a high-speed network transmission system can cause malfunctions, such as in the case of supply-voltage over or undershoots that violate chip operating conditions. In such cases, a chip in the system may behave erratically, and in the case of severe overshoot, the chip may be damaged in an irreparable way. Existing network test equipment may be operable to test functionalities of high-speed network transmission systems but the network test equipment is often not designed to test for current surges.

BRIEF DESCRIPTION OF THE DRAWINGS

Features of the present disclosure are illustrated by way of examples shown in the following figures. In the following figures, like numerals indicate like elements, in which.

DETAILED DESCRIPTION

Figure 1:
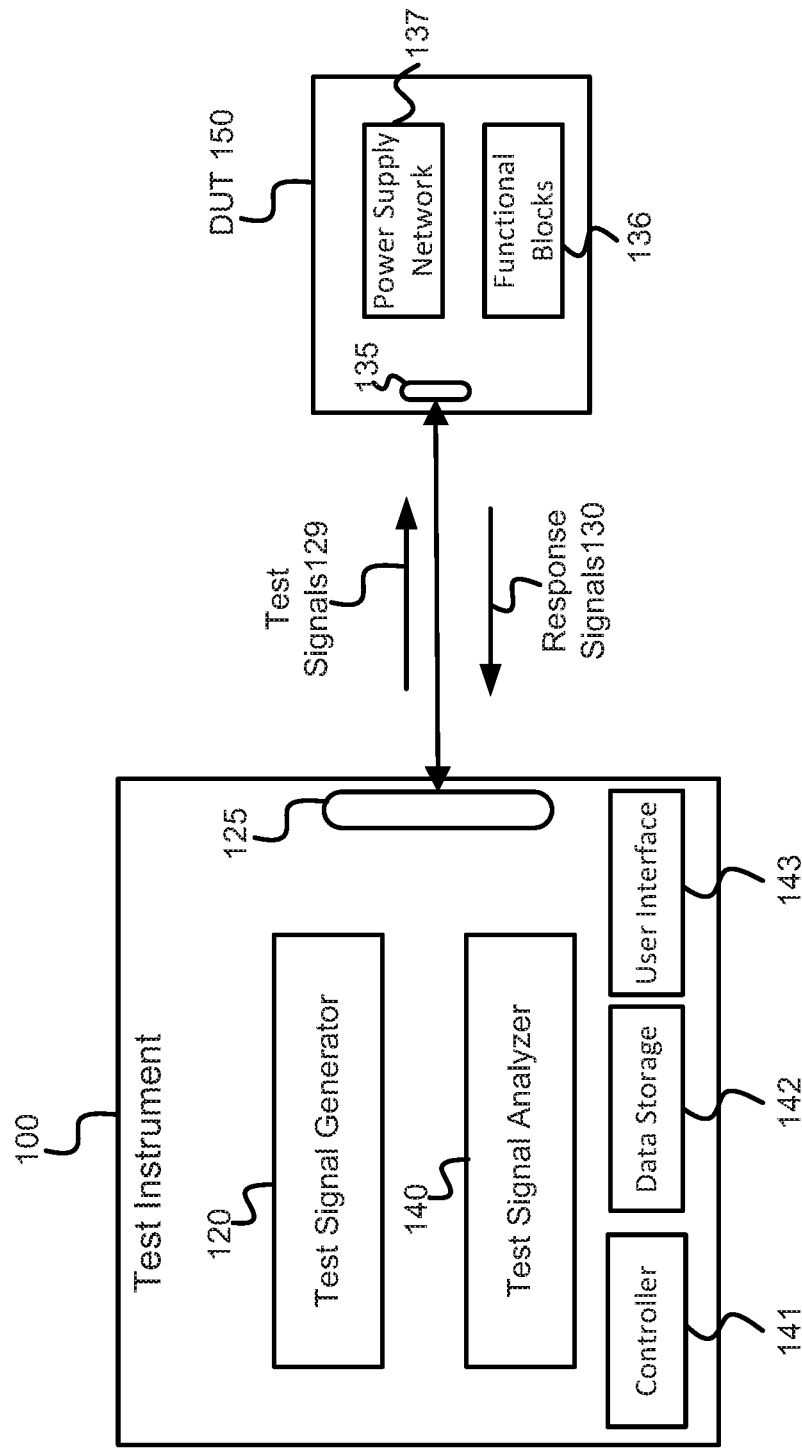
FIG. 1 is a block diagram of a test instrument connected to a device under test, according to an example of the present disclosure.

In the following description, numerous specific details are set forth in order to provide a thorough understanding of the present disclosure. It will be readily apparent however, that the present disclosure may be practiced without limitation to these specific details. In other instances, some methods and structures readily understood by one of ordinary skill in the art have not been described in detail so as not to unnecessarily obscure the description of the present disclosure. Also, for simplicity and illustrative purposes, the present disclosure is described below by referring mainly to examples. As used herein, the terms "a" and "an" are intended to denote at least one of a particular element, the term "includes" means includes but not limited to, the term "including" means including but not limited to, and the term "based on" means based at least in part on.

The present disclosure provides examples of a test instrument and methods for conducting power supply stress tests on a device under test (DUT). The DUT may include a network transmission component, such as a transponder, line card or another type of network interface, etc. According to an example of the present disclosure, the test instrument can perform power supply stress tests by generating test signals for transmission to the network interface of the DUT that cause current surges to be generated in the DUT at particular frequencies. A frequency of a current surge, as used herein, is the fundamental frequency of the current surge. A power supply stress test, also referred to herein as a stress test, may include invoking current surges in a controlled and repeatable manner in the DUT, whereby controlled refers to controlling parameters of the current surges, such as frequency, amplitude, duration, etc., generated in the DUT as is further described below.

In an example, test signals generated by the test instrument are transmitted to the network interface of the DUT to stimulate one or more functional blocks of the DUT, which causes current surges due to the functional blocks drawing power from the power supply network of the DUT to process the received test signals. For example, the test signals received at the DUT may cause the functional block of the DUT to execute signal processing operations at a heavy rate, which in turn causes a current surge to be generated by the power supply network of the DUT in order to supply sufficient power for the functional block to perform its operations responsive to the test signals. The test instrument may determine a range of frequencies for current surges that are to be generated in the DUT and generates test signals to cause the current surges in the range of frequencies. In an example, the range of frequencies may be provided by user input provided to the test instrument via a user interface, or may be provided by a remote system connected to the test instrument. In addition to causing current surges at desired frequencies, the test instrument may also cause current surges at desired amplitudes. Accordingly, the test instrument can perform stress tests on the DUT by stimulating functional blocks of the DUT to cause current surges over a desired range of frequencies and amplitudes in the DUT. A power supply network of a DUT may include the power supply and any power supply components and distribution medium for providing power to electrical components. A function block may include a circuit that performs operations responsive to received signals, such as functional blocks in the DUT that operate on test signals received from the test instrument.

In an example, the DUT comprises a network element that is able to receive data from a network and transmit the data to another network or an internal fabric. For example, the DUT may be a line card, a network interface card or a transponder. The DUT may include functional blocks that perform signal processing operations. For example, the functional blocks in the network element may include a packet processor, a forward error correction module and/or other functional blocks that may be implemented by hardware in the network element to process received signals and data in the signals. The functional blocks can be stimulated by the test signals to intentionally cause current surges at desired frequencies and/or amplitudes.

FIG. 1 illustrates a block diagram of a test instrument 100 whereby the test instrument 100 is connected to a DUT 150 via a test instrument interface 125, according to an example of the present disclosure. The test instrument interface 125 may include a network interface and one or more physical connectors. The test instrument can transmit signals to the DUT 150 and receive signals from the DUT 150 via the test instrument interface 125. The DUT 150 includes a network interface 135, which may also include one or more physical connectors. In an example, the physical connectors are male and female connectors that plug into each other. In another example, the interfaces 125 and 135 receive a cable, and the interfaces 125 and 135 may be connected via the cable, such as an optical cable or electrical cable. In an example, the interfaces 125 and 135 may include ports that are connectable to the cable.

The test instrument 100 may be implemented as a combination of hardware, firmware, and software (e.g., machine readable instructions executed by a processor). The test instrument 100 includes a test signal generator 120, which can generate test signals 129 for transmission to the DUT 150 via the test instrument interface 125. The test signals 129 may carry data to stimulate functional blocks in the DUT 150 as is further discussed below.

The test instrument 100 also includes a test signal analyzer 140 that receives response signals 130 from the DUT 150 via the test instrument interface 125, and may analyze the response signals 130. For example, the test signals 129 may include test signals designed to test various operations performed by the DUT 150 and designed to invoke current surges in the DUT 150. The response signals 130 received at the test instrument 100 from the DUT 150 may include signals generated by the DUT responsive to the test signals 129. For example, the DUT 150 may include functional blocks 136 that perform operations on the test signals 129 received from the test instrument 100. After the operations are performed by the functional blocks 136 on the test signals 129, the DUT 150 transmits response signals 130 to the test instrument 100. The response signals 130 may include loopback signals, such as a loopback of the test signals 129 after the operations are performed on the test signals 129. The response signals 130 are analyzed by test signal analyzer 140 of the test instrument 100 to determine parameters of the received test signals.

In an example, the DUT 150 is a network element, such as a line card, network interface card or a transponder. The network element may be a high-speed network element. For example, the DUT 150 may be a 10 GE, 40 GE, 100 GE, or 400 GE network element. The functional blocks for a network element DUT may include a packet processor, a forward error correction (FEC) module, and/or other functional blocks 136 that perform signal or data processing. The test signals 129 (e.g., electrical or optical signals) may be generated by the test signal generator 120 to test and/or stimulate the functional blocks 136, and the test signal analyzer 140 may monitor the response signals 130 received from the DUT 150, and may detect anomalies and/or errors. In an example, the test signals 129 may be generated to perform network traffic tests using different types of network traffic, such as unframed, physical coding sublayer (PCS), Ethernet, internet protocol (IP), or optical transport network (OTN) traffic. Depending on the protocol layer(s) tested, many different types of anomalies and/or errors may be detected, e.g., bit errors, bit error rate, bit slips, block errors, alignment marker errors, frame check sequence (FCS) errors, lost packets, misinserted packets, frame alignment signal (FAS) errors, multiframe alignment signal (MFAS) errors, and FEC errors. The test signal analyzer 140 may time-stamp and log any anomalies and/or errors detected responsive to tests performed with the test signals 129. The test signal analyzer 140 may also measure and log performance parameters. The test results, including any anomalies, errors, and/or performance parameters may be sent to the controller 141 and stored in data storage 142 and may be displayed via a user interface 143, which may include a graphical user interface.

Also, test signals 129 are designed to stimulate the functional blocks 136 to generate current surges in the DUT 150 to perform stress tests. For these stress tests, the test signal analyzer 140 may monitor the response signals 130 received from the DUT 150 to determine whether the response signals 130 indicate the DUT 150 is operating correctly under the stress test conditions or whether the DUT 150 is operating erratically or failing. In an example, the response signals 130 may be analyzed by the test signal analyzer 140 during the stress test to determine whether the response signals 130 include error corrected signals or not to determine whether the DUT 150 is malfunctioning under the stress test. Test results may be displayed on the user interface 143. The user interface 143 may include a display, keyboard, touchscreen and/or another type known input/output device. In an example, a user may input testing parameters via the user interface 143. The test signal generator 120 may generate the test signals 129 according to the testing parameters. Testing parameters may also be provided to the test instrument 100 from another computer, such as via a network interface or other type of interface (e.g., Wifi, Ethernet, USB, Bluetooth, etc.). Examples of the testing parameters are further discussed below.

According to an example of the present disclosure, the test instrument 100 can perform stress tests on the DUT 150 by generating current surges in the power supply network 137 of the DUT 150. The power supply network 137 may include a power supply, voltage regulators, power distribution traces and planes, decoupling capacitors and inductors, etc. The power supply network 137 should be able to maintain the supply voltage with a high precision under varying conditions, including conditions causing current surges. The test signals 129 received via the network interface 135 may stimulate the functional blocks 136 to perform operations, which results in the functional blocks 136 drawing current from the power supply network 137 and causing current surges. The test instrument 100 may vary parameters of the test signals 129 to cause generation of current surges that have a predetermined frequency spectrum and/or predetermined amplitude. For example, the test instrument 100 may determine a frequency spectrum of current surges to be generated in the DUT 150 and an amplitude of the current surges. The frequency spectrum and amplitude may be provided by a user via the user interface 143 or may be received from another system connected to the test instrument 100. The controller 141 may calculate parameters of test signals to be generated by the test signal generator 120 based on the frequency spectrum and amplitude of the current surges to be generated in the DUT 150, and provide the parameters to the test signal generator 120. The test signal generator 120 generates the test signals 129 to stimulate the functional blocks 136 to cause current surges having the frequency spectrum and the amplitude determined by the test instrument 100. Accordingly, the test instrument 100 is able to automatically generate test signals to cause current surges of predetermined frequencies and amplitude to be generated in the DUT 150 for stress testing the DUT 150.

The power supply network 137 should be able to maintain the supply voltage with a high precision under many varied conditions, otherwise the DUT 150 may behave erratically or fail. This requires a power supply network with a low impedance over a wide frequency band. However, high bit rate networking components in the DUT, such as complete modules or submodules, printed circuit boards (PCBs), field-programmable gate arrays (FPGAs), application-specific integrated circuits (ASICs), etc., can cause high amplitude power supply surge currents occurring over a wide frequency band. The test instrument 100 can stress test the DUT 150 by causing current surges over a plurality of predetermined frequencies, which may include a wide frequency band, and over a plurality of predetermined amplitudes. The stress testing may be performed by transmitting the test signals 129 to the DUT 150 via the test interface 125 and via the DUT's network or data interface, such as interface 135. The test signals 129 stimulate components of the DUT 150, such as the functional blocks 136 which may be implemented in modules, FPGAs, ASICs, etc., to cause the current surges over the plurality of predetermined frequencies and over the plurality of predetermined amplitudes. Examples are provided below for varying the test signals 129 to cause the current surges.

Controller 141 may determine testing parameters for the test signals 129. In an example, the controller 141 calculates the testing parameters for the test signals 129 to generate current surges having desire frequencies and amplitudes as is further discussed below. The controller 141 may include a hardware controller. In an example, the controller 141 includes a central processing unit (CPU) that executes machine readable instructions stored in a non-transitory computer readable medium. Data storage 142 may include memory or any suitable computer readable storage medium for storing data and/or machine-readable instructions used by the test instrument 100.

Figure 2:
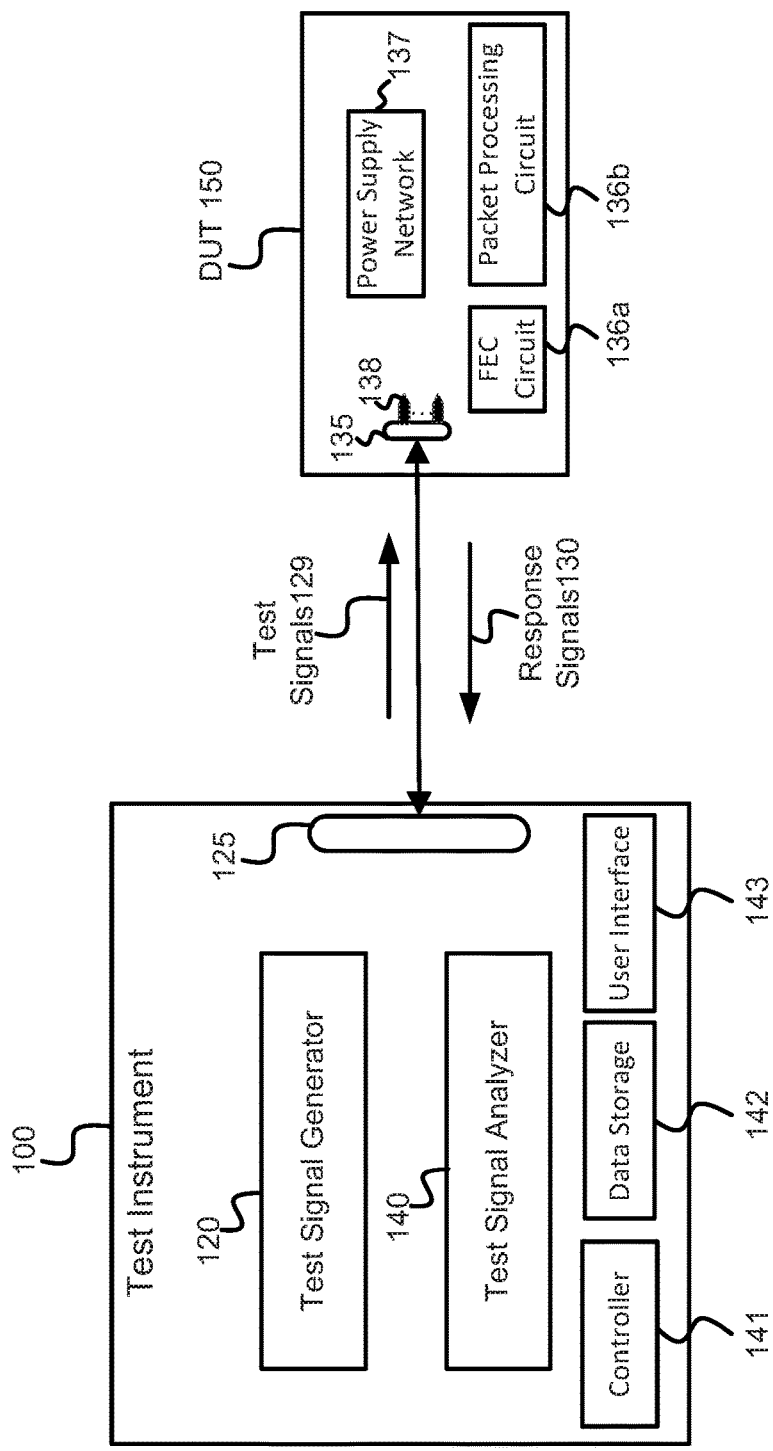
FIG. 2 is another block diagram of the test instrument connected to a device under test, according to an example of the present disclosure.

FIG. 2 shows examples of the functional blocks 136 that may be stimulated by the test signals 129 to generate the current surges in the DUT 150. As is generally discussed above, the test signals 129 are provided to the DUT 150 via interface 135. The data included in the test signals 129 is chosen by the test instrument 100 such that the functional blocks 136 are activated and deactivated in a controlled manner to produce current surges having predetermined parameters. The test instrument 100 may select the type of data as well as the duration and the repetition rate of certain data to include in the test signals 129 so the amplitude and the frequency of the current surges is controlled. FIG. 2 shows examples of the functional blocks 136 that are stimulated by the data in the test signals 129 to create controlled surges of predetermined frequency and amplitude.

For example, FEC circuit 136a is an example of one of the functional blocks 136 that may be in the DUT 150. FEC is a digital signal processing technique used to enhance data reliability through transmission of redundant data, called error correcting codes. FEC provides the receiver with the ability to correct errors without a reverse channel to request the retransmission of data. The test instrument 100 may stimulate the FEC circuit 136a by supplying bursts of codewords with correctable errors. A burst transmitted in the test signals 129 may include multiple codewords having errors occurring in consecutive bits. An error in a codeword may include an incorrect bit, such as "0" that is supposed to be a "1" or vice versa. A duration of a burst may be based on the number of codewords or bits in a burst. A burst repetition rate may include a number of transmitted bursts within a particular time interval. The FEC circuit 136a generates current surges depending on the error pattern of the codewords it processes. When a codeword with errors is processed, error detection and correction logic in the FEC circuit 136a causes a current surge in the DUT 150. The test instrument 100 may control the number of errors per codeword and/or the duration of a burst in the test signals 129 to control the amplitude of a current surge caused by the FEC circuit 136a processing the burst. The test instrument 100 may control the burst repetition rate to control the frequency of the current surge.

Another example of one of the functional blocks 136 may include packet processing circuit 136b. The packet processing circuit 136b may include a processor that is designed to perform packet processing functions at high through puts, e.g., line rates. For example, line cards often include one or more packet processors that performs packet processing functions, such as forwarding between ports, queuing, etc. In some cases, the packet processing circuit 136b may include one or more CPU cores to perform packet processing.

The packet processing circuit 136b may cause a current surge every time it processes a burst of packets. The test instrument 100 may stimulate the packet processing circuit 136b in a controlled manner to generate current surges in the DUT 150 having a predetermined frequency and/or amplitude. For example, the test instrument 100 controls the frequency of current surges caused by the packet processing circuit 136b by controlling the bit rate of the packet bursts in the test signals 129.

The DUT 150 may have an interface with multiple ports, such as ports 138 shown in FIG. 2. The test instrument 100 may transmit test signals to the ports 138 simultaneously to increase the amplitude of current surges. For example, if the DUT 150 is a line card, and the ports 138 are connected to one chip performing the packet processing, sending the test signals 129 simultaneously to the ports 138 increases the amplitude of the current surge caused by the chip. In another example, if a functional block is provided for each of the ports 138, the current surge caused by each of the functional blocks drawing power also has an increased amplitude. In an example, a worst-case scenario is tested by feeding synchronized stimulation data patterns of the test signals 129 into each of the ports 138 simultaneously. In case the DUT 150 has multiple parallel or cascaded functional blocks, such as the FEC circuit 136a and the packet processing circuit 136b or cascaded FEC circuits or cascaded packet processors, stimulation data patterns of the test signals 129 may be fed to the functional blocks at the same time to test a worst-case scenario by stimulating the functional blocks at the same time.

The controller 141 determines testing parameters for stress testing the DUT 150 with current surges. The testing parameters may include parameters of the current surges, such as frequency, amplitude, etc., to be generated in the DUT 150 as a result of stimulating one or more of the functional blocks 136 with the test signals 129. Also, the testing parameters may include parameters of the test signals 129, and may identify one or more of the functional blocks 136 to stimulate to generate the current surges, as is further described below. The controller 141 may compute parameters of the test signals 129 to produce current surges in the DUT 150 having desired frequencies and amplitude. Example of the computed parameters of the test signals 129 are further discussed below. Also, one or more of the testing parameters may include user-selected parameters received via the user interface 143. In another example, testing parameters may be received from another system or may be pre-programmed and/or may be user-selected.

Examples of the testing parameters are now described. According to an example, a user of the test instrument 100 may select, via the user interface 143, a functional block to stress test the DUT 150. For example, assume the test instrument 100 receives a selection of a FEC power supply stress test, which is associated with stimulating a FEC functional block such as the FEC circuit 136a. To perform the FEC power supply stress test, the test instrument 100 generates correctable symbol error sequences in the test signals 129 to stimulate current surges by causing the FEC circuit 136a to perform error correction on the received test signals 129.

Figure 4:
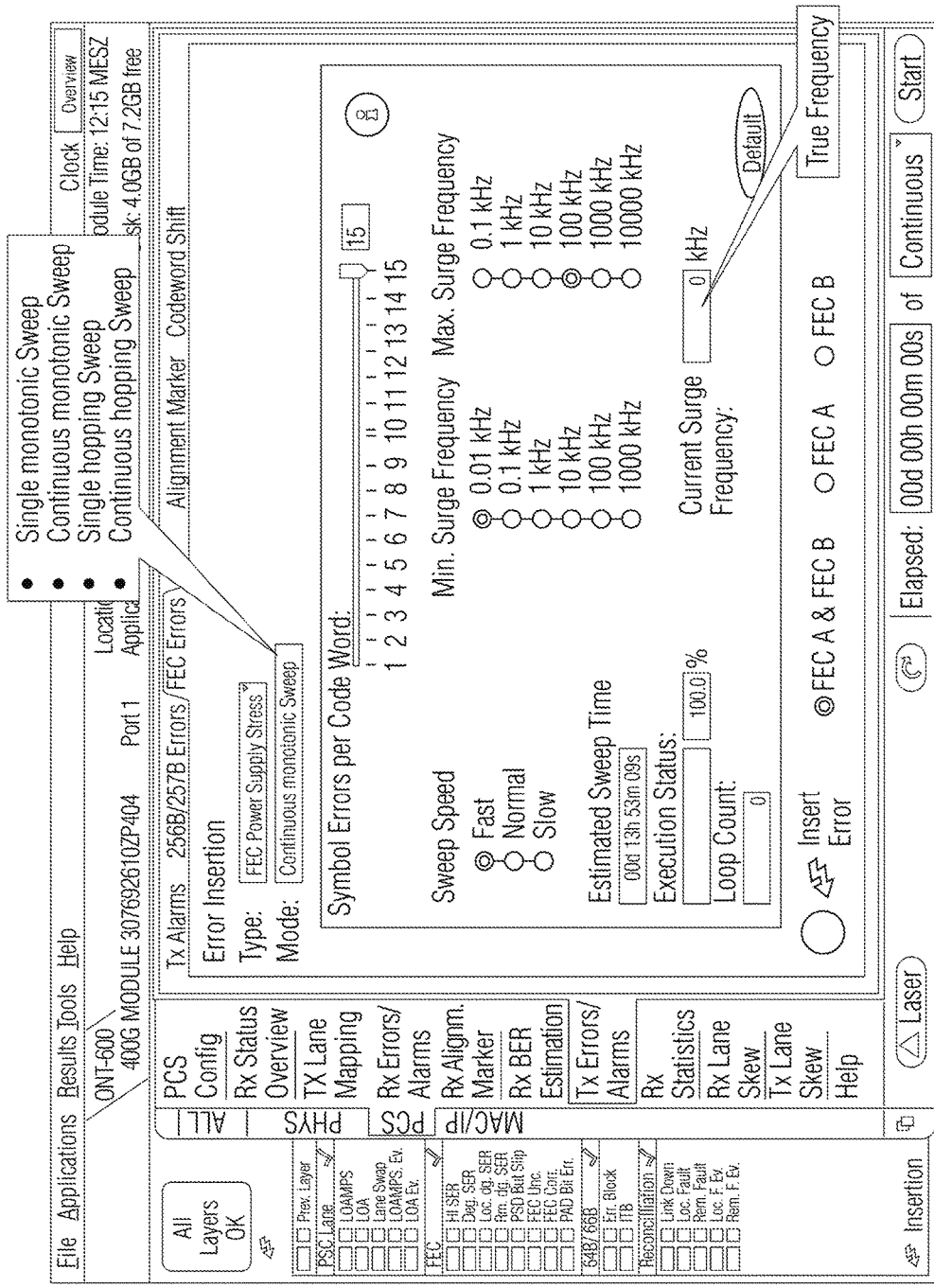
FIG. 4 is a screen shot of a user interface of a test instrument, according to an example of the present disclosure.

The controller 141 may determine testing parameters, such as the functional block to stimulate (e.g., FEC circuit 136a), a range of frequencies for the current surges to be stimulated by the FEC circuit 136a or a single frequency for generating a single current surge, a sweep mode or sweep type for sweeping through the range of current surges, a sweep speed describing how fast to sweep through the range of frequencies, and other parameters. Some of the test parameters may be received via the user interface 143 of the test instrument 100. FIG. 4 illustrates an example of a screen shot of the user interface 143, and shows examples of test parameters that may be received via the user interface 143. For example, the test instrument 100 may receive, via the user interface 143, a type of stress test. In this example, the type is selected as FEC power supply stress test. A sweep mode may be selected. Monotonic or hopping sweep modes, which are discussed below, may be selected. In this example, the selected sweep mode is monotonic. Also, the sweep speed may be selected, such as slow (e.g., 400 steps per decade), medium (e.g., 200 steps per decade) and fast (e.g., 100 steps per decade), and in this example, "fast" is selected. The frequency range is also selected between a minimum surge frequency and a maximum surge frequency, inclusive. For example, a range may be selected between 0.01-10,000 kHz. In this example, the selected range is between 0.01-100 kHz. The symbol errors per code word may also be selected (e.g., 1-15), which impacts the amplitude of the current surge. In this example, the highest value is selected, such as 15, to maximize amplitude to test for worst case. Also, if there is more than one FEC functional block in the DUT 150, one or more of the FEC blocks may be selected to stimulate. In this example, two FEC blocks, A and B, are selected to maximize the amplitude of the current surge. As the stress test is performed, the user interface 143 may display current results at any given time during the frequency sweep, such as the true frequency of the current surge that is generated by stimulating the FEC circuit 136a, the sweep speed, etc.

Based on the testing parameters, the controller 141 computes parameters of the test signals 129 to generate current surges in the DUT 150 in a controllable and repeatable manner that have the desired test parameters. The following describes an example of generating current surges for the FEC power supply stress test in a controllable and repeatable manner based on test parameters discussed above. The test instrument 100 performs the FEC power supply stress test by transmitting bursts of correctable codeword errors with varying burst periods in the test signals to generate power supply current surges with desired frequencies. The surge frequency is swept through a user defined range with a user definable speed. The frequency range is defined by setting a minimum and a maximum frequency. The sweep is decadic with the same number of steps in every decade. For example, the swept bands range from 1 to 6 decades. Table 1 below shows an example of swept frequency band ranges for each decade.

TABLE 1

| Decade# | Min. Frequency [kHz] | Max. Frequency [kHz] |
|---|---|---|
| 1 | 0.01 | 0.1 |
| 2 | 0.1 | 1 |
| 3 | 1 | 10 |

TABLE 1-continued

| Decade# | Min. Frequency [kHz] | Max. Frequency [kHz] |
|---|---|---|
| 4 | 10 | 100 |
| 5 | 100 | 1000 |
| 6 | 1000 | 10000 |

The controller 141 may use equations discussed below to determine parameters for the test signals 129 to cause the current surges in the desired frequency range. Table 2 below describes the variables in the equations.

TABLE 2

| | |
|---|---|
| Codeword Rate | The number of FEC codewords per second. |
| Wanted Frequency | The desired current surge frequency |
| Decade# | The current decade number, e.g., decade# = 1, 2, 3, 4, 5, 6 |
| Step# | The current frequency step number within the current decade. Step# = 0, 1, . . ., No_of_Steps-1 |
| Steps per Decade | The number of frequency steps within a decade, e.g., No_of_Steps = 100, 200, or 400 |
| Step Duration | The duration of a frequency step. Step duration is variable. Step duration is calculated in such a way that a step takes at least 10 true burst periods. Step time may not be shorter than 100 ms (1 tick). |
| Wanted Burst Size | The theoretical burst size |
| True Burst Size | The actual burst size |
| True Burst Size limited | The actual burst size limited to a duration of at least 2 codewords. Shorter bursts are not possible since bursts always need an active and a passive phase. |
| True Burst active | The actual active phase duration of the burst |
| True Burst Pause | The actual pause duration of the burst |
| True Frequency | The actual frequency of the surge generated |
| Tries to step ratio | Hopping sweep only: The ratio is number of tries/number of steps. There are more tries than steps to ensure every step is hit with a reasonable probability. |

The equations are as follows:

$$\text{Wanted Frequency} = 10^{Decade\#} * 10^{\frac{Step\#}{Steps\_per\_Decade}} \quad \text{EQ1}$$

$$\text{Wanted Burst Size} = \frac{\text{Codeword Rate}}{\text{Wanted Frequency}} \quad \text{EQ2}$$

$$\text{True Burst Size} = \text{Round to nearest integer}(\text{Wanted Burst Size}) \quad \text{EQ3}$$

$$\text{True Burst Size limited} = \text{MAX}(\text{True Burst Size}, 2) \quad \text{EQ4}$$

$$\text{True Burst active} = INT\left(\frac{\text{True Burst Size limited} + 1}{2}\right) \quad \text{EQ5}$$

$$\text{True Burst Pause} = \text{True Burst Size limited} - \text{True Burst active} \quad \text{EQ6}$$

$$\text{True Frequency} = \frac{\text{Codeword Rate}}{\text{True Burst Size limited}} \quad \text{EQ7}$$

$$\text{Step Duration} = \text{MAX}\left(0, 1; \frac{10}{\text{True Frequency}}\right) \quad \text{EQ8}$$

Based on the equations provided above, the controller 141 can determine the number of codewords with errors and the number of codewords without errors to include in each burst of the test signals 129 for the FEC power supply stress test to cause the current surges in the DUT 150 with the wanted frequencies. Pseudocode of machine readable instructions executed by the controller 141 to perform the FEC power supply stress test in the monotonic sweep mode is as follows:

```
FOR (Decade = Low_Decade) TO (High_Decade-1) STEP 1
   FOR (Step = 0) TO Steps_per_Decade STEP 1         /* Do one step more to cover the
max. frequency */
      Wanted_Frequency = (10^Decade) * 10^(Step/ Steps_per_Decade)
      Wanted_Burst_Size = Codeword_Rate/Wanted_Frequency
      True_Burst_Size = ROUND_TO_INTEGER(Wanted_Burst_Size);   /* Round to
nearest integer */
      True_Burst_Size_limited = MAX(True_Burst_Size, 2);       /* burst size
>= 2*/
      True_Burst_active = INTEGER[(True_Burst_Size_limited+1)/2];          /*
True_Burst_active >= True_Burst_Pause */
      True_Burst_Pause = True_Burst_Size_limited − True_Burst_active;
      True_Frequency = Codeword_Rate/True_Burst_Size_limited;
      /* Set burst: M codewords with error, N codewords without error */
      Set_Burst(M=True_Burst_active, N=True_Burst_Pause);
      /* Make sure step duration is at least 10 true burst periods and never shorter than 1
tick.
         Step duration is rounded up to the next tick*/
      Step_Duration[Ticks] = INTEGER[(100/True_Frequency)+1];         /* Step
duration in ticks */
      WAIT(Step_Duration);
   NEXT Step
NEXT Decade
```

As can be seen in the pseudocode above, the controller 141 calculates the "M" number of codewords with errors and the "N" number of codewords without errors for each burst transmitted in each step to cause a current surge of wanted frequency to be generated for each step. "M" and The pseudocode presented above is for the monotonic sweep mode. The sweep mode can alternatively be hopping. Below is an example of pseudocode for the hopping sweep mode:

```
Tries_to_Steps_Ratio = 2.5;
FOR (Try = 1)        TO  INT((High_Decade-Low_Decade)*            Steps_per_Decade
*Tries_to_Steps_Ratio) STEP 1
      Decade = Random_Integer(Low_Decade, (High_Decade-1));        /* Random decade
within band */
      Step = Random_Integer(0, Steps_per_Decade);                   /* Random step
within decade */
      Wanted_Frequency = (10^Decade) * 10^(Step/ Steps_per_Decade)
      Wanted_Burst_Size = Codeword_Rate/Wanted_Frequency
      True_Burst_Size = ROUND_TO_INTEGER(Wanted_Burst_Size);             /* Round to
nearest integer */
      True_Burst_Size_limited = MAX(True_Burst_Size, 2);                 /* Make sure
burst size >= 2*/
      True_Burst_active = INTEGER[(True_Burst_Size_limited+1)/2];        /* Make sure
active >= pause */
      True_Burst_Pause = True_Burst_Size_limited − True_Burst_active;
      True_Frequency = Codeword_Rate/True_Burst_Size_limited;
      /* Set burst: M codewords with error, N codewords without error */
      Set_Burst(M=True_Burst_active, N=True_Burst_Pause);
      /* Make sure step duration is at least 10 true burst periods and never shorter than 1
tick.
         Step duration is rounded up to the next tick*/
      Step_Duration[Ticks] = INTEGER[(100/True_Frequency)+1];                      /* Step
duration in ticks */
      WAIT(Step_Duration);
NEXT Try
```

"N" are integers. As indicated above, the bursts are transmitted in the test signals 129 to the DUT 150 to generate the current surges. Because the FEC power supply stress test is a sweep covering a range of frequencies, the wanted frequency needs to change for each step to cover the range. The "M" number of codewords with errors and the "N" number of codewords without errors transmitted in a burst control the frequency of the current surge. Accordingly, the controller 141 calculates "M" and "N" for each step to generate the wanted or desired frequency for that step. Thus, the test instrument 100 is able to generate current surges in the DUT 150 have the desired frequencies in a controlled and repeatable manner. Also, the amplitude of the current surges can be controlled as well, such as based on symbol errors per codeword and based on number of stimulated FEC blocks.

For the hopping sweep mode, the frequency is swept randomly instead of consecutively. As indicated in the pseudocode presented above, this may be done by randomly selecting a decade within a band and randomly selecting a step within each decade. Also, for the hopping sweep mode only, there are more tries than steps to ensure every step is hit with a reasonable probability.

The example discussed above stimulates one or more FEC functional blocks to generate current surges in the DUT 150. According to another example, the packet processing circuit 136*b* may be stimulated to generate current surges in the DUT 150. The packet processing circuit 136*b* draws power from the power supply network 137 to process incoming packets, and current surges are caused in the DUT 150 in response to an incoming packet burst. To control the current surges, the controller 141 of the test instrument 100 controls the burst period of packet bursts transmitted in the test signals 129 to stimulate the packet processing circuit 136b to cause current surges of wanted frequencies in the DUT 150. Based on the bit rate and packet length of the burst, the controller 141 can calculate the burst period of packets. The frequency of the current surge is generally equivalent to the burst period, e.g., burst period of 1 millisecond (ms)=1 kHz current surge frequency.

The controller 141 may use equations discussed below to determine parameters for the test signals 129 to cause the current surges in the desired frequency range by stimulating the packet processing circuit 136b. Table 3 below describes the variables in the equations.

TABLE 3

| Acronym | Description |
|---|---|
| Wanted Frequency | The desired surge frequency |
| Bitrate | — |
| Packet Size | Size of a packet in bits |
| Interpacket gap | The gap between packets in bits |
| Decade# | The current decade number. Decade# = 1, 2, 3, 4, 5, 6 |
| Step# | The current frequency step number within the current decade. Step# = 0, 1, . . ., No of Steps-1 |
| Steps per Decade | The number of frequency steps within a decade. No of Steps = 100, 200, or 400 |
| Step Duration | The duration of a frequency step. Step duration is variable. Step duration is calculated in such a way that a step takes at least 10 true burst periods. Step time is never shorter than 100 ms (1 tick). |
| Wanted Burst Size | The theoretical burst size |
| True Burst Size | The actual burst size |
| True Burst Size limited | The actual burst size limited to a duration of at least 2 packets. Shorter bursts are not possible since bursts always need an active and a passive phase. |
| True Burst active | The actual active phase duration of the burst |
| True Burst Pause | The actual pause duration of the burst |
| True Frequency | The actual frequency of the surge generated |

The equations are as follows:

$$\text{Wanted Frequency} = 10^{Decade\#} * 10^{\frac{Step\#}{Steps\_per\_Decade}} \quad \text{EQ9}$$

$$\text{Packet Rate} = \frac{\text{Bitrate}}{\text{Packet Size} + \text{Interpacket Gap}} \quad \text{EQ10}$$

$$\text{Wanted Burst Size} = \frac{\text{Packet Rate}}{\text{Wanted Frequency}} \quad \text{EQ11}$$

$$\text{True Burst Size} = \text{Round to nearest integer}(\text{Wanted Burst Size}) \quad \text{EQ12}$$

$$\text{True Burst Size limited} = \text{MAX}(\text{True Burst Size}, 2) \quad \text{EQ13}$$

$$\text{True Burst active} = INT\left(\frac{\text{True Burst Size limited} + 1}{2}\right) \quad \text{EQ14}$$

$$\text{True Burst Pause} = \text{True Burst Size limited} - \text{True Burst active} \quad \text{EQ15}$$

$$\text{True Frequency} = \frac{\text{Packet Rate}}{\text{True Burst Size limited}} \quad \text{EQ16}$$

$$\text{Step Duration} = \text{MAX}\left(0, 1; \frac{10}{\text{True Frequency}}\right) \quad \text{EQ17}$$

Equations 9-17 above are applicable to constant bitrate traffic with constant packet size only. The controller 141 may use equations 9-16 to determine the burst size or the burst period to vary for each step to generate the desired frequency for each step. Similar to as described with respect to the FEC power supply stress test, the sweep may be monotonic or hopping.

Figure 3:
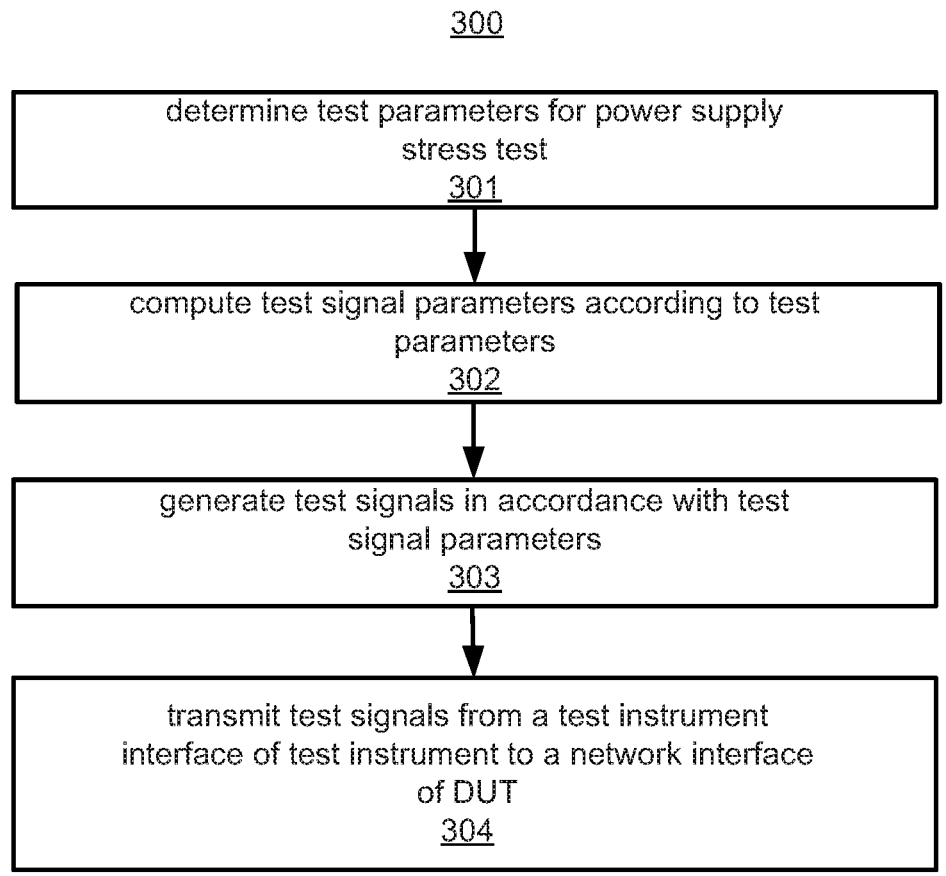
FIG. 3 is a flow chart of a method for testing a device under test, according to an example of the present disclosure.

FIG. 3 illustrates a method 300 for stress testing a DUT according to an example of the present disclosure. The method 300 is described by way of example as being performed by the test instrument 100 shown in FIGS. 1 and 2 testing the DUT 150.

At 301, the test instrument 100 determines test parameters for a power supply stress test. Test parameters are described above. Some examples of the test parameters may include the functional block to stimulate (e.g., FEC, packet processor, etc.), a range of frequencies for the current surges to be stimulated by the functional block, a sweep mode (e.g., continuous or hopping), a sweep speed describing how fast to sweep through the range of frequencies, and other parameters. Some of the test parameters may be received via the user interface 143 of the test instrument 100.

At 302, the test instrument 100 computes test signal parameters according to the test parameters. Examples of the test signal parameters are described above, which may be computed, such as by the controller 141, according to the equations discussed above. For example, the test signal parameters may include a number of codewords with errors and a number of codewords without errors for stimulating a FEC block or a burst period of packets for stimulating a packet processor.

At 303, the test instrument 100 generates test signals in accordance with the test signal parameters. For example, the test signal generator 120 generates the test signals based on the test signal parameters.

At 304, the test instrument 100 transmits the test signals from a test instrument interface of the test instrument to a network interface of the DUT, wherein the test signals stimulate at least one functional block in the DUT to generate current surges having the test parameters. For example, the test signals 129 are transmitted from the test instrument 100 via the test interface 125 to the DUT 150 via the network interface 135. By way of example, the test signals 129 may include a number of codewords with errors and a number of codewords without errors, such as determined by the controller 141, for stimulating the FEC circuit 136a, or the test signals 129 may include packet bursts having a burst period, such as determined by the controller 141, for stimulating the packet processing circuit 136b. The stimulated functional blocks 136 generate current surges having the wanted frequencies and amplitude for stress testing the DUT 150.

The response signals 130 may be received response to the functional blocks 136 processing the test signal 129. For the stress test, the test instrument 100 may display the response signals 130 and/or parameters of the response signals 130 via the user interface 143. In an example, the parameters may include error correction information which indicates whether codewords were error corrected in response to the FEC circuit 136a performing error correction for a loopback signal. If the error correction is correct (e.g., codewords with errors are corrected), then an indication may additionally be generated that the stress test is passed. If the error correction is incorrect or outside predetermined tolerances, then an indication may additionally be generated that the stress test is failed. Similarly, if the packet processing circuit 136b correctly processes the test signals 129 (e.g., correctly routes the packets), the response signals 130 may include loopback signals of the test signals 129; otherwise, the loopback signals may not be received by the test instrument which is indicative of a failed stress test.

While preferred embodiments are disclosed herein, many variations are possible which remain within the concept and scope of the inventions. Such variations would become clear to one of ordinary skill in the art after inspection of the specification, drawings, and claims herein. This invention therefore is not to be restricted except within the spirit and scope of the appended claims.

What is claimed is:

1. A test instrument connectable to a device under test (DUT), the test instrument comprising:
    a test instrument interface couplable to a network interface of the DUT;
    a hardware controller to:
        determine at least one frequency for a current surge to be generated in the DUT; and
        calculate parameters of test signals to generate based on the at least one frequency and a functional block in the DUT to stimulate with the test signals; and
    a test signal generator to generate the test signals in accordance with the calculated parameters, and to transmit the test signals to the network interface of the DUT via the test instrument interface.

2. The test instrument of claim 1, wherein the functional block of the DUT causes the current surge having the at least one frequency to be generated in the DUT responsive to the DUT receiving at least one of the test signals.

3. The test instrument of claim 1, wherein the at least one frequency comprises a range of frequencies, and the test signal generator generates the test signals to stimulate the functional block to generate current surges over the range of frequencies.

4. The test instrument of claim 3, wherein the test signal generator generates the test signals to generate the current surges consecutively starting with a minimum frequency in the range of frequencies and ending with a maximum frequency in the range of frequencies.

5. The test instrument of claim 3, wherein the test signal generator generates the test signals to randomly generate the current surges over the range of frequencies.

6. The test instrument of claim 3, wherein the test signal generator generates the test signals to generate the current surges over the range according to a selected sweep speed.

7. The test instrument of claim 1, wherein the controller is to determine at least one amplitude for the current surge and is to calculate the parameters for the test signals based on the at least one frequency and the at least one amplitude.

8. The test instrument of claim 1, wherein the function block is a forward error correction circuit in the DUT, and the parameters of the test signals include at least one of a number of codewords with errors and a number of codewords without errors in the test signals.

9. The test instrument of claim 1, wherein the function block is a FEC circuit in the DUT, and the parameters for the test signals include a number of symbol errors per codeword in the test signals.

10. The test instrument of claim 1, wherein the function block is a packet processor in the DUT and the parameters for the test signals include a burst period of packets in the test signals.

11. The test instrument of claim 1, wherein the network interface of the DUT comprises multiple ports, and the test signals are transmitted to the multiple ports in parallel.

12. The test instrument of claim 1, wherein the DUT comprises multiple functional blocks, and the test signals stimulate the multiple functional blocks at the same time.

13. A test instrument connectable to a device under test (DUT), the test instrument comprising:
    a test instrument interface couplable to a network interface of the DUT;
    a processing circuit to:
        determine test parameters for a power supply stress test; and
        compute test signal parameters according to the test parameters; and
    a test signal generator to generate test signals in accordance with the test signal parameters,
    wherein the test signals are transmitted from the test instrument interface to the network interface of the DUT, and the test signals stimulate at least one functional block in the DUT to generate current surges having the test parameters.

14. The test instrument of claim 13, wherein the test parameters comprise a range of frequencies for the current surges.

15. The test instrument of claim 14, wherein the test signal generator generates the test signals to generate the current surges consecutively starting with a minimum frequency in the range of frequencies and ending with a maximum frequency in the range of frequencies.

16. The test instrument of claim 13, wherein the test parameters comprise a sweep speed.

17. The test instrument of claim 13, wherein the test parameters comprise an amplitude of the current surges.

18. The test instrument of claim 13, wherein the test parameters include the at least one functional block from a plurality of functional blocks in the DUT that are operable to be stimulated by the test instrument.

19. A method of performing a power supply stress test from a test instrument, the method comprising:
    determining test parameters for a power supply stress test;
    computing test signal parameters according to the test parameters;
    generating test signals in accordance with the test signal parameters; and
    transmitting the test signals from a test instrument interface of the test instrument to a network interface of a DUT, wherein the test signals stimulate at least one functional block in the DUT to generate current surges having the test parameters.

20. The method of claim 19, wherein the test parameters comprise at least one of a number of codewords with errors and a number of codewords without errors in a codeword burst transmitted in the test signals, and a burst period of packets in the test signals.

* * * * *